United States Patent [19]
Rubin

[11] Patent Number: 5,227,941
[45] Date of Patent: Jul. 13, 1993

[54] PROTECTIVE CIRCUIT FOR DIODE SWITCHING DEVICE

[75] Inventor: Daniel Rubin, Nes Ziona, Israel

[73] Assignee: Systel Development & Industries Ltd., Rehovoth, Israel

[21] Appl. No.: 614,666

[22] Filed: Nov. 16, 1990

[30] Foreign Application Priority Data

Dec. 1, 1989 [IL] Israel .................................. 92514

[51] Int. Cl.$^5$ ............................................. H02H 9/00
[52] U.S. Cl. ............................................ 361/18; 361/58; 361/84; 307/127
[58] Field of Search .................. 361/18, 100, 111, 58, 361/93, 110, 8, 9, 10, 84; 307/127

[56] References Cited

U.S. PATENT DOCUMENTS 4,623,998 11/1986 Volut .................................. 361/13
5,036,450 7/1991 Kelleher et al. ................... 361/18

OTHER PUBLICATIONS

German Patent Abstract, DE-3008-312 Sep. 1981.

*Primary Examiner*—Todd E. DeBoer
*Attorney, Agent, or Firm*—Benjamin J. Barish

[57] ABSTRACT

An electrical circuit supplying a load from a voltage source includes a switching device and a diode, and is to be protected from recovery current caused by momentary reversal of the diode current during the operation of the switching device. The electrical circuit further includes a transformer having an excitation winding sensing the reverse recovery current through the diode immediately after operation of the switching device, and a sink winding inductively coupled to the excitation winding for inducing in the sink winding a current proportional to the current in the excitation winding. A unidirectional conducting device directs the current induced in the sink winding to the diode to cause reverse recovery of the diode.

20 Claims, 10 Drawing Sheets

BASIC CONFIGURATION

BASIC SWITCHING DIODE CIRCUIT

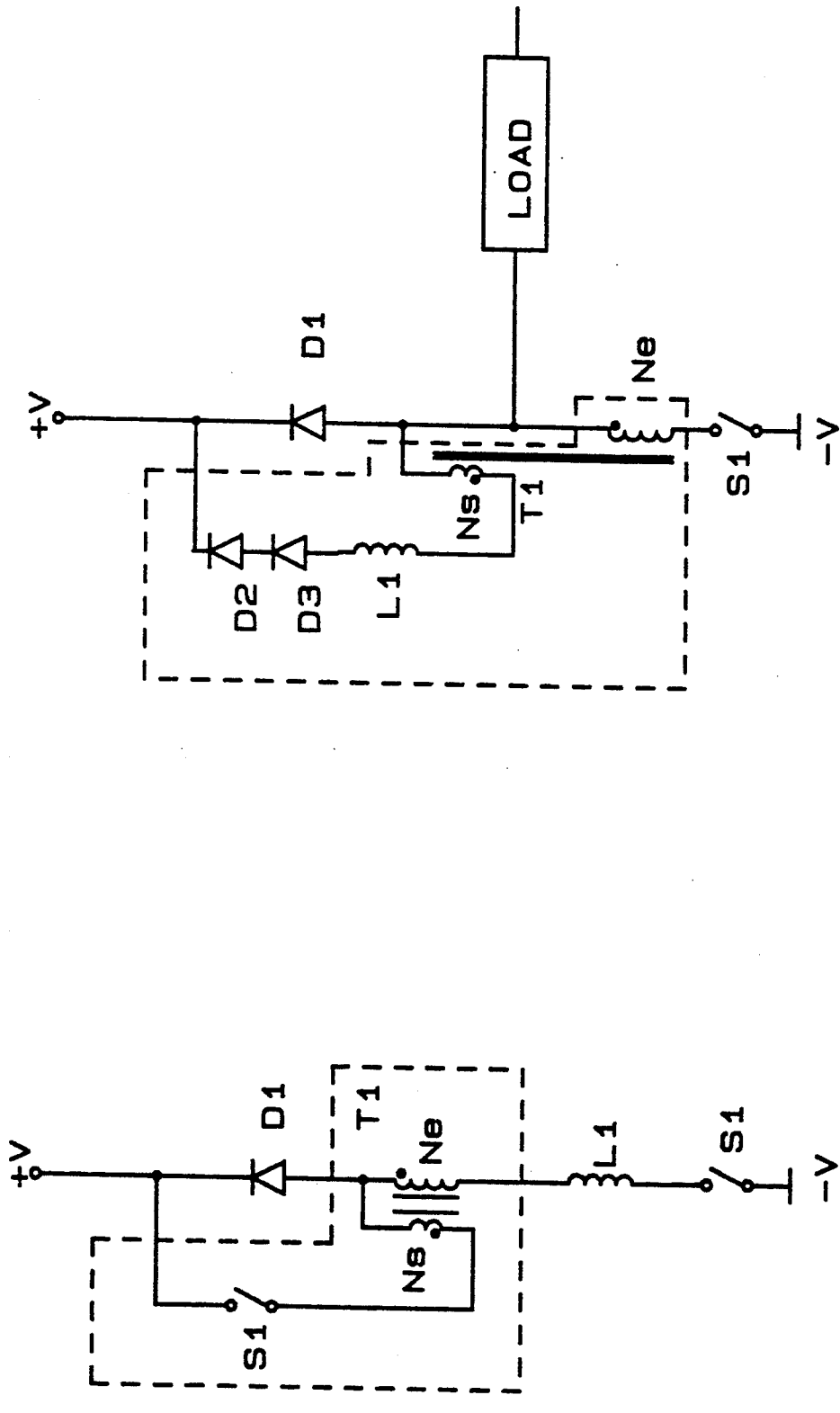

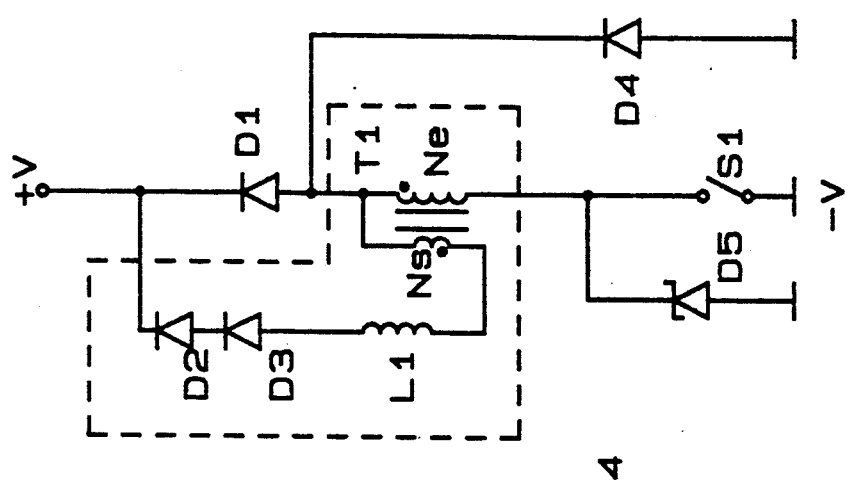
FIG 7 SWITCH PROTECTION DIODE ADDED
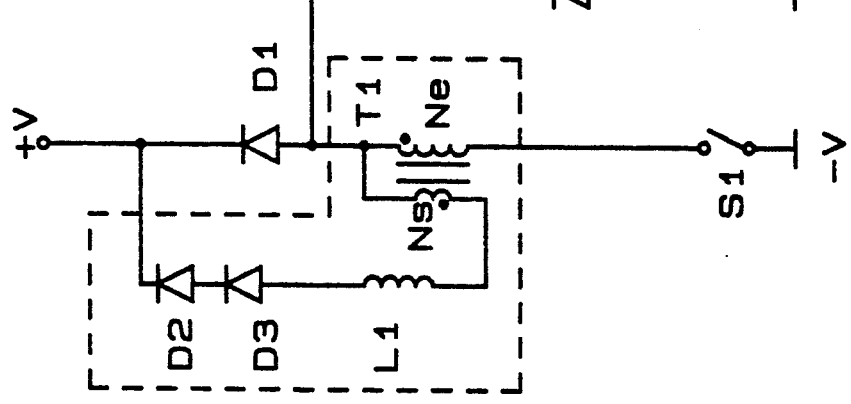
FIG 6 CLAMP DIODE ADDED
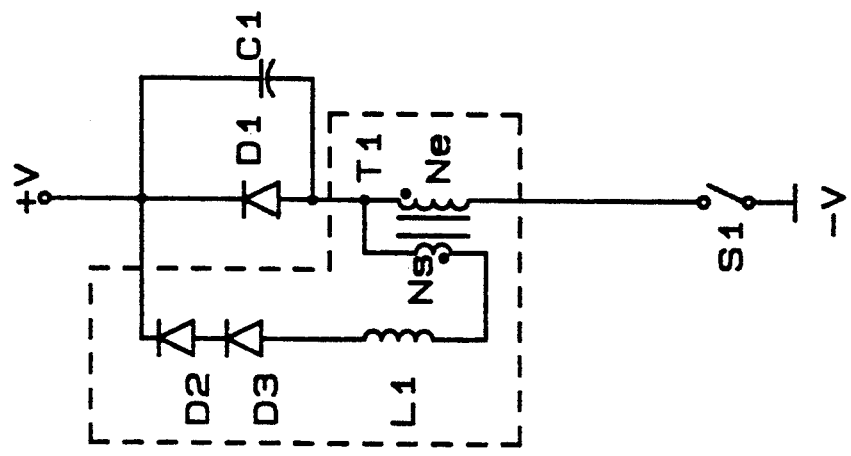
FIG 5 DIODE PARASITIC CAPACITOR OR dv/dt CONTROL CAPACITOR

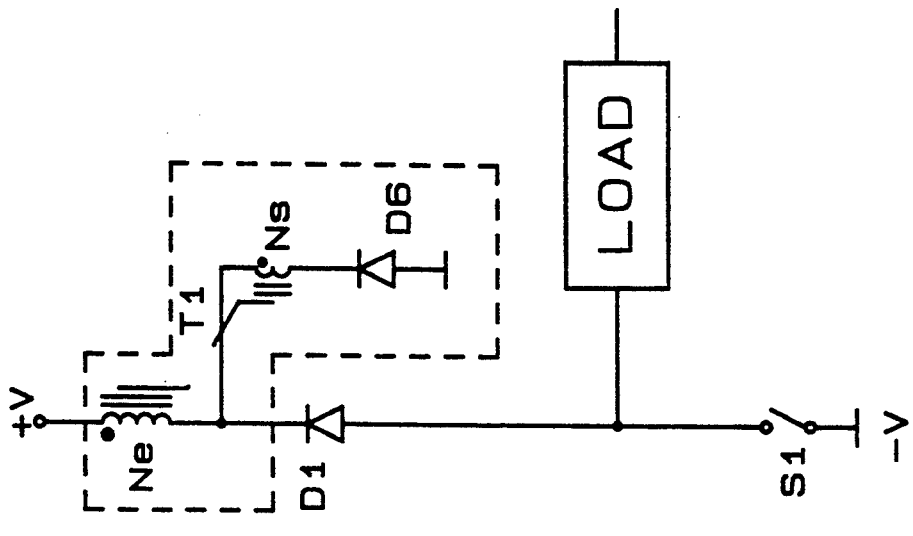
FIG 9 SINGLE DIODE CONFIGURATION
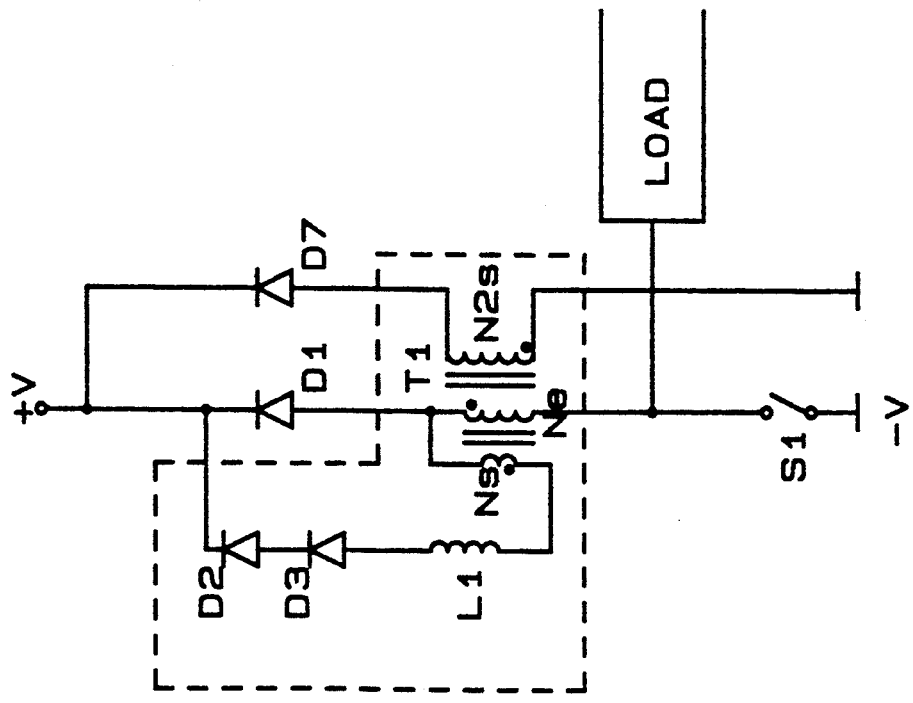
FIG 8 WINDING ADDED TO RECICLE TRANSFORMER'S STORED ENERGHY

APPLICATION TO VARIOUS CONVERTERS

BUCK CONVERTER

BOOST CONVERTER

RECOVERY AID FOR POWER BRIDGE COMPRISES A SINGLE TRANSFORMER AND SINGLE DIODE

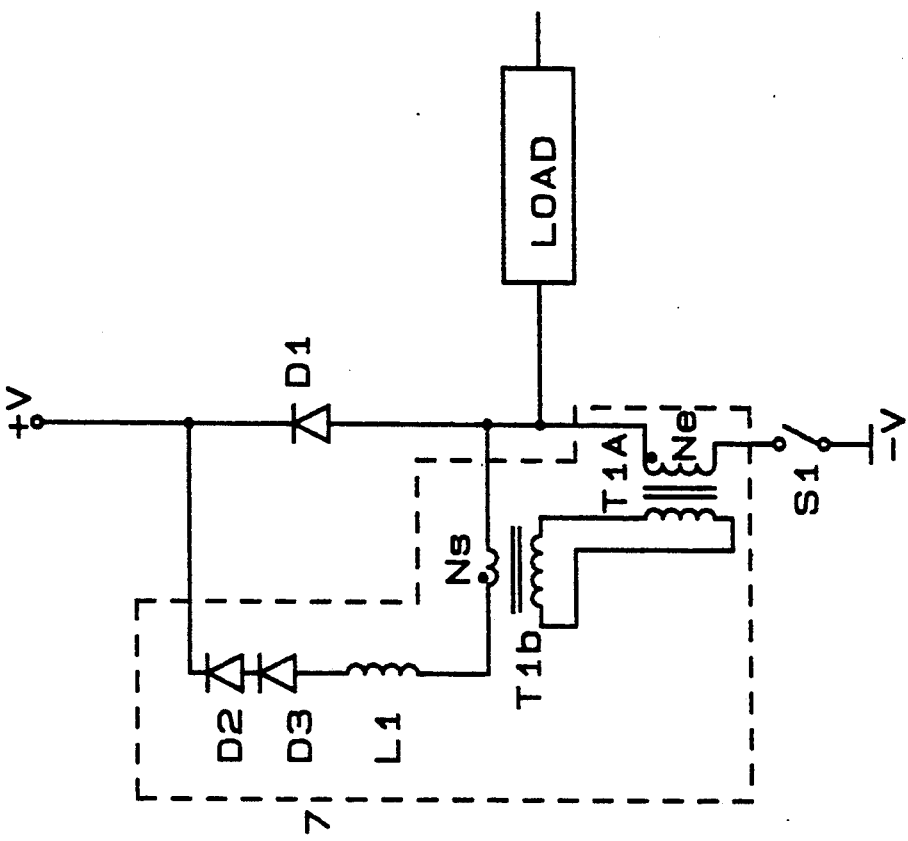
FIG16 TWO TRANSFORMERS EMBODIMENT
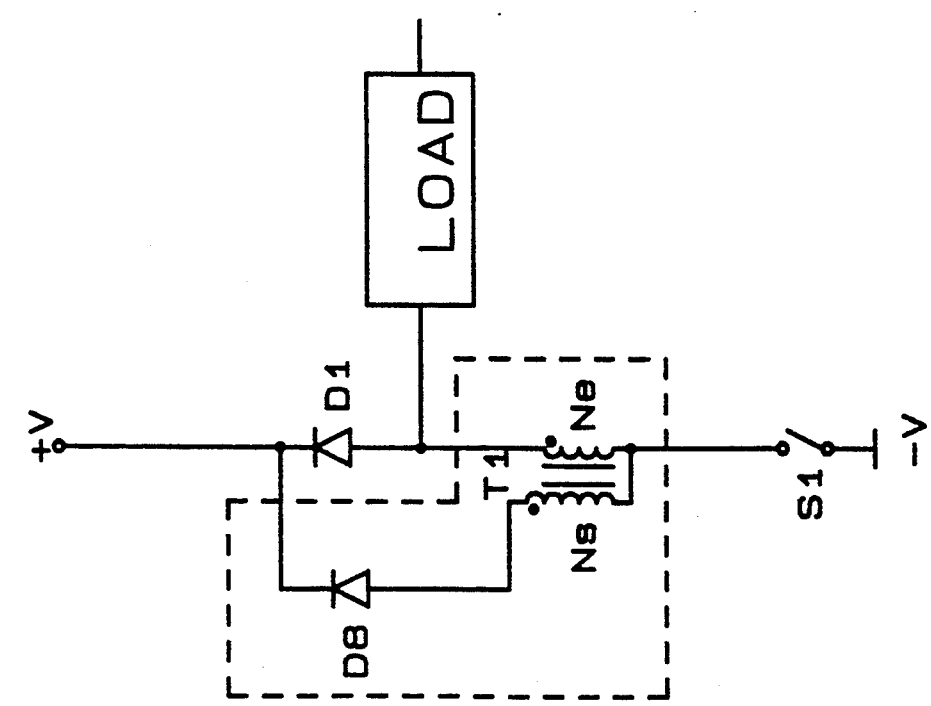
FIG15 SINGLE DIODE CONFIGURATION

TWO EXITATION COILS EXAMPLE

PROTECTIVE CIRCUIT FOR DIODE SWITCHING DEVICE

FIELD AND BACKGROUND OF THE INVENTION

The present invention relates to circuits for protecting systems which include diode switching devices against the effects of diode reverse recovery currents which occur upon the switching of a diode.

One of the serious problems involved in electrical circuits including switching devices and diodes, such as power supplies, inverters, motor drivers, and the like, is the problem of reverse recovery current resulting when the diode is switched off, which causes the current through the diode to be momentarily reversed. Thus, when a diode that was forwardly biassed is switched from forward conduction to reverse the diode behaves as a short circuit during the first few nanoseconds or microseconds until all the stored charge in the diode is recovered. This causes an extremely high magnitude of current, called reverse recovery current, to flow through the diode and the switching device during this recovery period. This recovery current places a considerable stress on the diode and the switching device, and also wastes a considerable quantity of energy in the form of heat. This recovery current also causes energy accumulated in effective inductors and capacitor of the circuit to be radiated as electrical noise.

One known solution for this problem of diode recovery is to include an inductor in series with the electrical switch. While this solution protects the electrical switch, it does not solve the problem of wastage of energy. In addition, the inductor generates high-voltage spikes, and therefore it is common to include a zener diode to absorb the excess voltage, but this also does not solve the problem of wastage of energy. The common solution is to use an ultrafast-acting diode, but such diodes are very expensive, if available at all, for particular applications producing a relatively high forward voltage drop.

The probelm is even more severe when using MOSFET's (metal oxide semi-conductor field effect transistor), particularly in bridge configurations. Thus, if the integral Drain/Source is allowed to conduct, the whole device is limited upon reapplying the dv/dt. In order to stay at a safe level of dv/dt, it is necessary to add a large serial inductance and large parallel capacitors. These components cause an additional waste of power. Another solution is to prevent conduction in the diode in the MOSFET by inserting a serial diode, to block backward conduction, and bypassing the MOSFET diode combination by an additional diode, parallel to the combination. However, these solutions are expensive and significantly increase the circuit losses.

OBJECTS AND BRIEF SUMMARY OF THE INVENTION

An object of the present invention is to provide an electrical circuit of the foregoing type, i.e., including a switching device and a diode, with improved means for protecting the circuit from recovery current occurring when the polarity of the diode is reversed.

According to the present invention, there is provided an electrical circuit supplying a load from a voltage source, and including a switching device and a diode, which circuit is to be protected from reverse recovery current caused by momentary reversal of the diode current during the operation of the switching device, characterized in that the electrical circuit comprises: a transformer having an excitation winding sensing the reverse recovery current through the diode immediately after operation of the switching device, and a sink winding inductively coupled to the excitation winding for inducing in the sink winding a current proportional to the current in the excitation winding; and a unidirectional conducting device connected to direct the current induced in the sink winding to the diode to cause reverse recovery of the diode.

The transformer may sense the recovery current directly, or indirectly, e.g., by reflection. Also, the unidirectional conducting device preferably has a voltage drop larger than that of the protected diode.

The invention may be implemented in many forms. For example, the unidirectional conducting device may be an electronic switch, a diode, or a plurality of diodes connected in series. The latter is particularly advantageous, since it is possible to manufacture small ultrafast diodes having high voltage drops which have no influence on the particular ciruit. Moreover, the current density in the plurality of diodes is extremely high, and therefore the charge which is accumulated during forward conduction is reduced.

The invention is also particularly advantageous when applied in MOSFET circuits, where the intregal diodes normally exhibit a relatively high minority charge, and therefore cause long recovery time and high losses.

The turns ratio of the transformer determines the fraction of the current which flows away from the voltage source, during the recovery process and therefore which produces the power losses. Accordingly, the turns ratio should be kept as high as possible within practical limits. In this respect, a high turns ratio is difficult to achieve without increasing unwanted serial induction; diodes conducting during short periods tend to develop a forward voltage drop from several volts to several tenths of volts.

Further features and advantages of the invention will be apparent from the description below.

BRIEF DESCRIPTION OF THE DRAWINGS

The invention is herein described, by way of example only, with reference to the accompanying drawings, wherein:

FIGS. 2–17 illustrate various circuits in accordance with the present invention which may be used for solving or reducing this problem.

DESCRIPTION OF PREFERRED EMBODIMENTS

Figure 1:
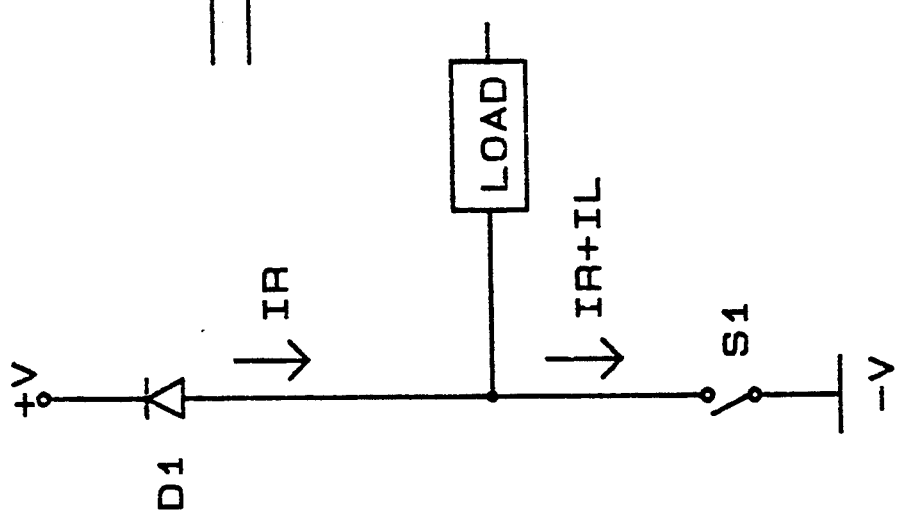
FIG. 1 is a circuit diagram illustrating a known basic switching diode circuit in which the diode polarity is reversed causing the problem of recovery current as described earlier.

Reference is first made to FIG. 1 which illustrates the basic switching diode circuit. Thus, when a diode D1 that was forward biassed is subjected to a reverse voltage, the diode behaves as a short circuit for a short period of time (known as the recovery time) until all the stored charge is recovered. This generates a reverse current (IR) which, together with the load current (IL), is applied to the switching device (S1). Accordingly, this recovery current produces a momentary over-current and over-voltage which places considerable stress on the diode D1, may be destructive of the switch (S1), and also wastes a considerable amount of energy in the form of heat.

FIGS. 2–17 illustrate different circuits which may be used according to the invention to recycle most of the recovered charge back to the voltage source. Thus, only a small fraction of the recovery current flows through the active switch, thereby solving or reducing the above problems.

Figure 2:
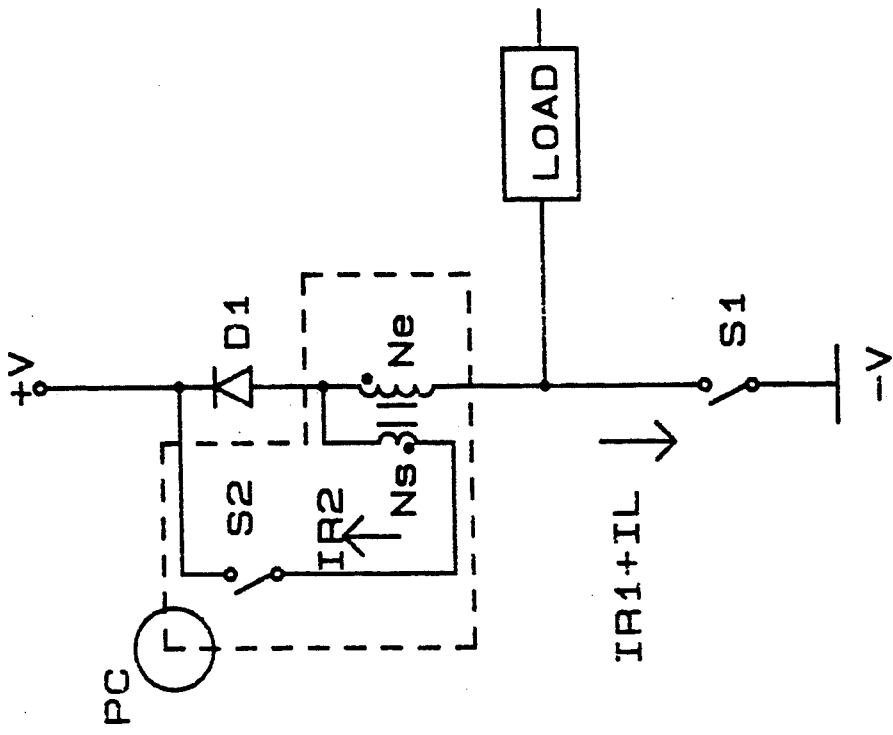

FIG. 2 illustrates a basic configuration for solving or reducing the above problem. Thus, the protective circuit identified by block PC in FIG. 1 includes a transformer $T_1$ having an excitation winding $N_E$ in series with the protected diode $D_1$ so as to sense the recovery current through the diode immediately after closing of the switching device $S_1$. Transformer $T_1$ also includes a sink winding $N_S$ inductively coupled to the excitation winding $N_E$ for inducing in the sink winding a reverse current correponding to the current in the excitation winding.

The protective circuit 1 illustrated in FIG. 2 further includes a unidirectional conductive device in the form of a switch $S_2$ in series with the sink winding $N_S$ and connecting it across the protected diode $D_1$. Switch $S_2$, if not controlled, has a voltage drop larger than that of the protected diode $D_1$ and is therefore effective to direct at least a portion of the reverse recovery current from the sink winding $N_S$ the potected diode.

The reverse current $IR_1$ which momentarily flows through the excitation winding $N_E$ of transformer $T_1$ induces a much larger current $IR_2$ through the sink winding $N_S$, and switch $S_2$. Therefore, the current $IR_1$ which flows from the voltage source V to switch $S_1$ is significantly smaller than the total diode recovery current which is the sum of $IR_1$ and $IR_2$. The part of the recovered charge which flows in the reverse direction through the diode from the voltage source V is thus significantly reduced, and so is the power loss.

FIG. 3 illustrates the same circuit as FIG. 2, and therefore the corresponding parts are identically numbered, except that an inductor $L_1$ is included in series with the excitation winding $N_E$ and the switching device $S_1$ to further reduce the current stress on the switching device.

FIG. 4 illustrates a variation wherein the inductor $L_1$ is added in series with the sink winding $N_S$ of the transformer $T_1$, instead of in series with the excitation winding $N_E$. FIG. 4 illustrates the further variation wherein the unidirectional conducting device is in the form of a pair of diodes $D_2$, $D_3$, providing the above-described advantages when using a diode pair for the unidirectional conducting device. In addition, the excitation winding $N_E$ is connected to the switch $S_1$ in order not to interrupt the commutation action of diode $D_1$.

FIG. 5 illustrates a circuit wherein a capacitor $C_1$ is connected across the protected diode $D_1$ to limit the rate of voltage rise across the protected diode.

FIG. 6 illustrates an electrical circuit including a clamping diode $D_4$ connected across the excitation winding $N_E$ and the switching device $S_1$ to protect the protected diode $D_1$ from voltage transients.

FIG. 7 illustrates an electrical circuit wherein a zener diode $D_5$ is connected across the switching device $S_1$, to limit the voltage rise on the switching device $S_1$.

FIG. 8 illustrates an electrical circuit wherein the transformer $T_1$ includes a second sink winding $N_{2s}$ coupled to a second unidirectional conducting device $D_7$, which latter circuit further aids in recovering back to the voltage source energy stored in the transformer.

FIG. 9 illustrates an electrical circuit wherein the sink winding $N_S$ of the transformer $T_1$ is connected to direct at least a portion of the recovery current back to the voltage source V via the excitation winding $N_E$ of the transformer.

Figure 10:
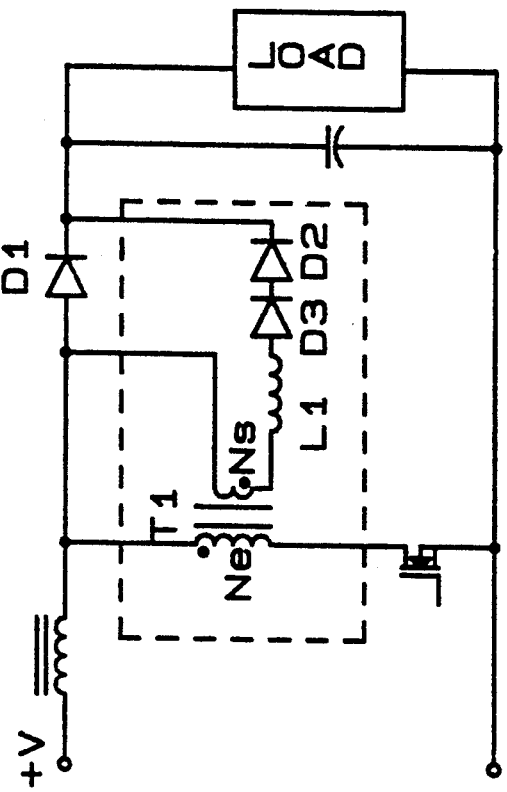

FIG. 10 illustrates an electrical circuit corresponding to that of FIG. 4 but embodied in a buck converter, wherein the switching device $S_1$ is a MOSFET, and the output of the protected diode is supplied to the load via a coil and capacitor.

Figure 11:
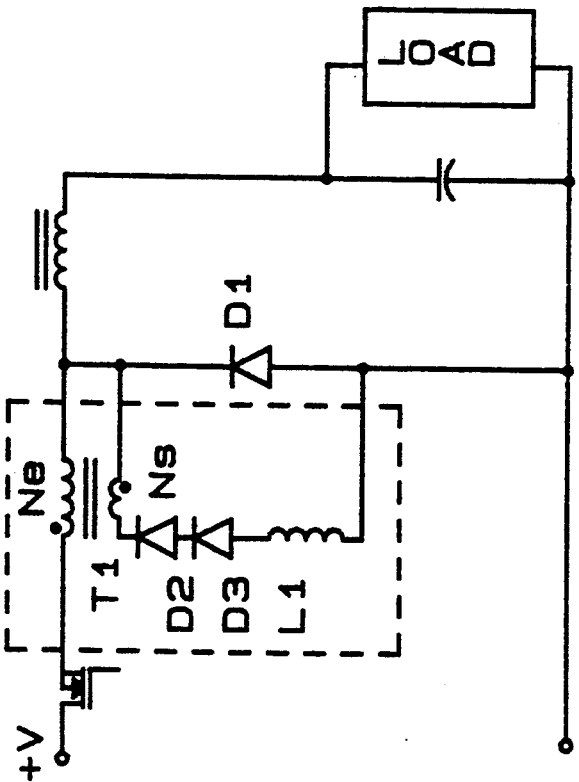

FIG. 11 illustrates an electrical circuit similar to that of FIG. 10, but embodied in a boost converter type.

Figure 12:
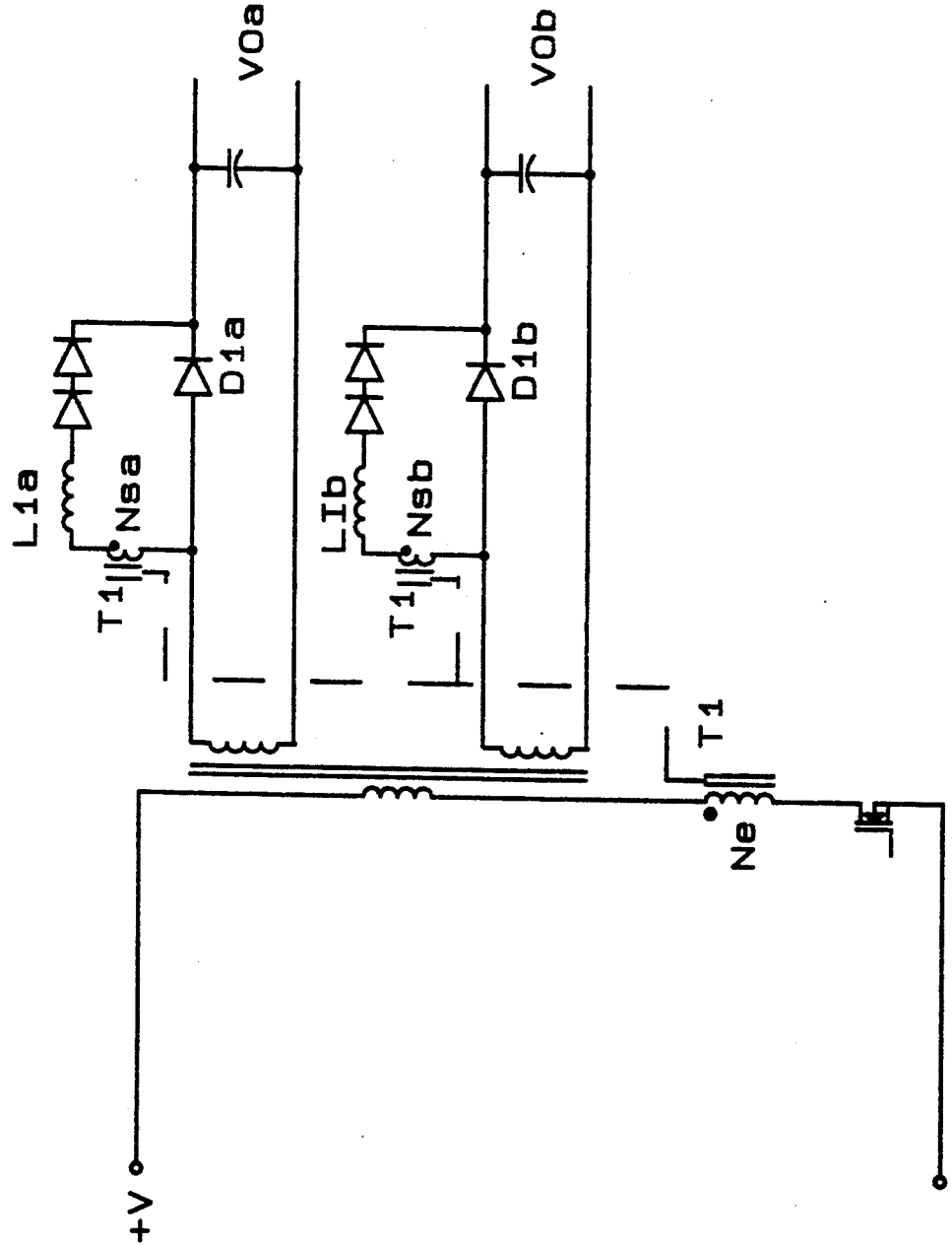

FIG. 12 illustrates an electrical circuit in which two diodes $D_{1a}$, $D_{1b}$ are to be protected, each being protected by a sink winding $N_{sa}$, $N_{sb}$ coupled to the excitation winding $N_E$ in series with the switching device $S_1$.

Figure 13:
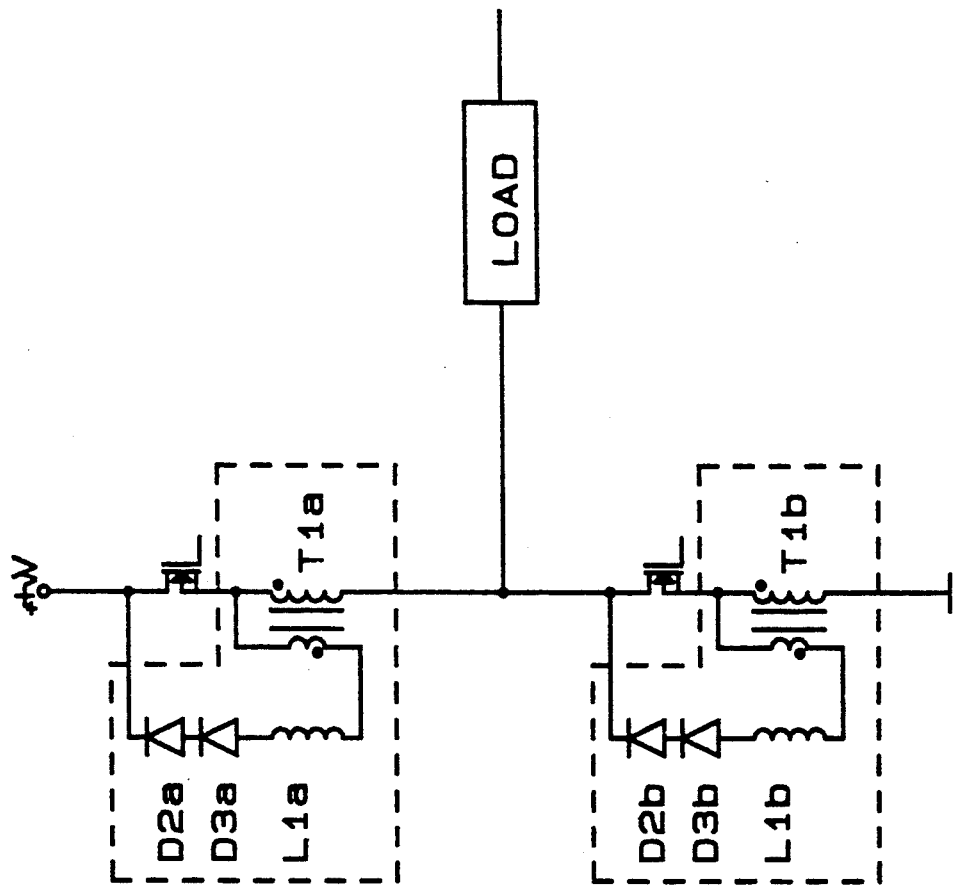

FIG. 13 illustrates an electrical circuit including two MOSFET's, each protected by a protective circuit corresponding to that illustrated in FIG. 4. In the circuit of FIG. 13, when one MOSFET acts as the switching device, the other acts as the diode to be protected.

Figure 14:
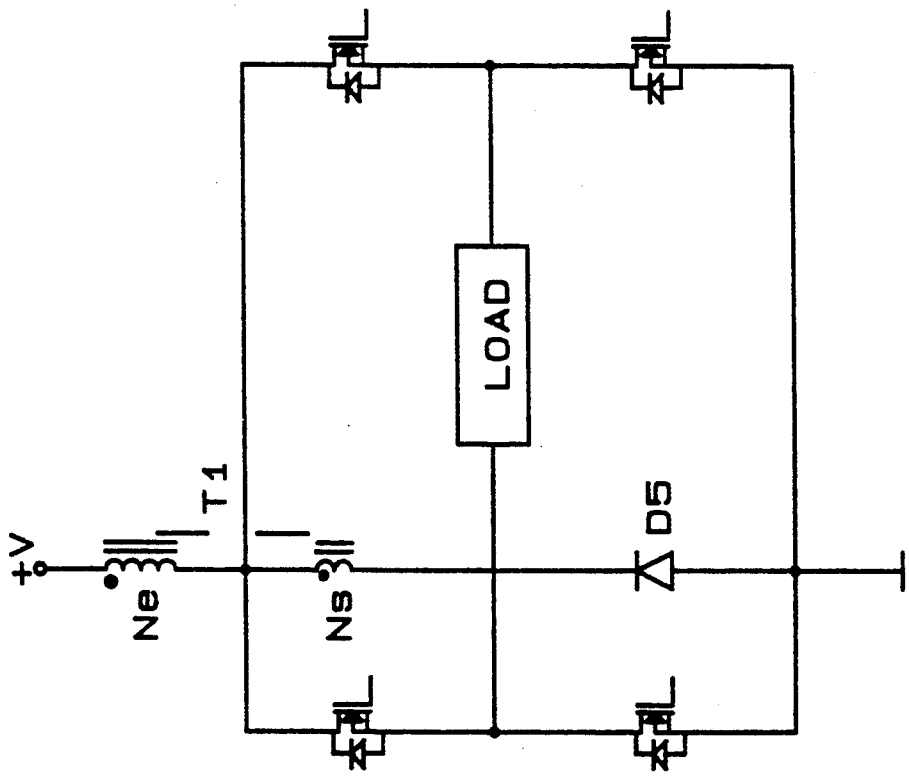

FIG. 14 illustrates an electrical circuit including four MOSFET's arranged in a bridge configuration, including a single transformer and a single unidirectional conducting device. Thus, when two MOSFET's act as switching devices, the other two act as diodes to be protected. The single transformer $T_1$ includes a single excitation winding $N_E$ and a single sink winding $N_S$ effective, with unidirectional conducting device $D_9$ to protect all four MOSFET's FIG. 15 illustrates an electrical circuit wherein the sink winding $N_S$ is connected to the excitation $N_E$ at a point on the ladder remote from its connection to the protected diode $D_1$. The unidirectional device is shown as a diode $D_8$ but could be a plurality of diodes in series or an electronic switch.

FIG. 16 illustrates a circuit in which the transformer is split into two transformers $T_{1a}$, $T_{1b}$, in order to obtain higher turns ratios.

Figure 17:
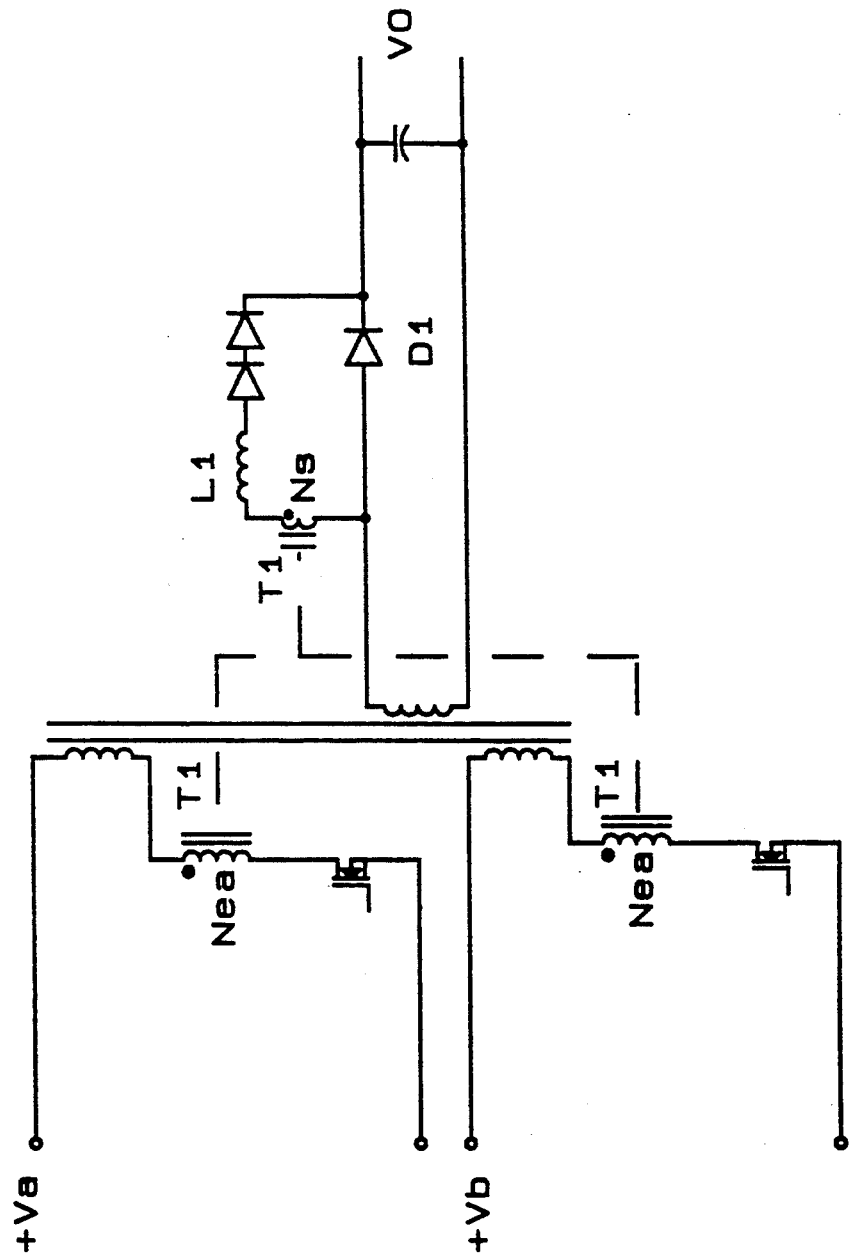

FIG. 17 illustrates an electrical circuit having two (or more) input circuits, each including an excitation coil $T_E$.

While the invention has been described with respect to a large number of preferred embodiments, it will be appreciated that these are shown merely for purposes of example, and that many variations, modifications and applications of the invention may be made.

What is claimed is:

1. An electrical circuit supplying a load from a voltage source, and including a switching device and a diode, which circuit is to be protected from reverse recovery current caused by momentary reversal of the diode current during the operation of the switching device, characterized in that said electrical circuit comprises:

a transformer having an excitation winding sensing the reverse recovery current through the diode immediately after operation of the switching device, and a sink winding inductively coupled to said excitation winding for inducing in the sink winding a current proportional to the current in the excitation winding; and a unidirectional conducting device connected to direct the current induced in the sink winding to the diode to cause reverse recovery of the diode.

2. The electrical circuit according to claim 1, wherein said unidirectional conducting device has a voltage drop larger than that of the protected diode.

3. The electrical circuit according to claim 1, wherein said unidirectional conducting device is an electronic switch.

4. The electrical circuit according to claim 1, wherein said unidirectional conducting device is a diode.

5. The electrical circuit according to claim 1, wherein said unidirectional conducting device includes a plurality of diodes in series.

6. The electrical circuit according to claim 1, wherein said protected diode is in a semiconductor switching device.

7. The electrical circuit according to claim 1, wherein said transformer has a high turns ratio.

8. The electrical circuit according to claim 1, further including an inductance in series with said excitation winding and switching device.

9. The electrical circuit according to claim 1, further including an inductance in series with said sink winding.

10. The electrical circuit according to claim 1, further including a capacitor connected across said protected diode to limit the rate of voltage rise thereacross.

11. The electrical circuit according to claim 1, further including a clamping diode connected across said excitation winding and switching device to protect the protected diode from voltage transients.

12. The electrical circuit according to claim 1, further including a zener diode across said switching device to protect the protected diode from voltage transients.

13. The electrical circuit according to claim 1, wherein said transformer includes a second sink winding coupled to a second unidirectional conducting device for aiding in recovering back to the voltage source energy stored in the transformer.

14. The electrical circuit according to claim 1, wherein said transformer includes a second sink winding coupled to said excitation winding, and a second unidirectional conducting device connected to direct at least a portion of the reverse current from said second sink winding back to the voltage source.

15. The electrical circuit according to claim 1, where the sink winding is connected to direct at least a portion of the reverse current from the protected diode back to the voltage source via the excitation winding.

16. The electrical circuit according to claim 1, wherein said electrical circuit includes a plurality of protected diodes, and said transformer includes a sink winding and unidirectional conducting device for each protected diode.

17. The electrical circuit according to claim 1, wherein said electrical circuit includes a MOSFET having said protected diode, and another MOSFET serving as said switching device.

18. The electrical circuit according to claim 16, wherein there are four MOSFET's arranged in a bridge configuration, two having the protected diodes, and the remaining two serving as switching devices.

19. The electrical circuit according to claim 1, wherein the transformer is split into two transformer sections, one feeding the other, in order to obtain a higher turns ratio.

20. The electrical circuit according to claim 1, wherein there are two input circuits, each including a diode and an excitation coil.

* * * * *